US006815150B2

(12) United States Patent
Nakahara et al.

(10) Patent No.: US 6,815,150 B2
(45) Date of Patent: Nov. 9, 2004

(54) PHOTORESIST STRIPPING COMPOSITION AND PROCESS FOR STRIPPING RESIST

(75) Inventors: Hijiri Nakahara, Osaka (JP); Yukihiko Takeuchi, Osaka (JP); Ryou Hashimoto, Osaka (JP); Taketo Maruyama, Chiba (JP); Hisaki Abe, Niigata (JP)

(73) Assignees: Sharp Kabushiki Kaisha, Osaka (JP); Mitsubishi Gas Chemical Co., Inc., Tokyo (JP)

( * ) Notice: Subject to any disclaimer, the term of this patent is extended or adjusted under 35 U.S.C. 154(b) by 0 days.

(21) Appl. No.: 10/315,073

(22) Filed: Dec. 10, 2002

(65) Prior Publication Data

US 2003/0152874 A1 Aug. 14, 2003

(30) Foreign Application Priority Data

Dec. 12, 2001 (JP) ....................................... 2001-379140

(51) Int. Cl.[7] .............................. G03F 7/40; G03F 7/42

(52) U.S. Cl. ....................... 430/323; 430/329; 430/331; 510/176

(58) Field of Search ................................ 430/329, 331, 430/323; 510/176

(56) References Cited

U.S. PATENT DOCUMENTS

| | | | | |
|---|---|---|---|---|
| 5,102,777 A | * | 4/1992 | Lin et al. | 430/329 |
| 6,458,517 B2 | * | 10/2002 | Nohara et al. | 430/329 |
| 6,638,694 B2 | * | 10/2003 | Ikemoto et al. | 430/329 |
| 2001/0034313 A1 | * | 10/2001 | Honda et al. | 510/176 |

FOREIGN PATENT DOCUMENTS

| | | | |
|---|---|---|---|
| EP | 1031884 | * | 8/2000 |
| EP | 1043629 | * | 10/2000 |

* cited by examiner

*Primary Examiner*—Richard L. Schilling
(74) *Attorney, Agent, or Firm*—Antonelli, Terry, Stout & Kraus, LLP

(57) ABSTRACT

The invention provides a photoresist stripping composition including (a) an alkanolamine other than those alkanolamines falling under the definition of the below-described component (b); (b) an alkanolamine having in the molecule thereof at least one moiety represented by the following formula (1):

$$HOR_4—N(H)—C(R_1)(R_2)—OH \quad (1)$$

(wherein each of $R_1$ and $R_2$ represents hydrogen or a methyl group, and $R_4$ represents a C1–C5 alkyl group); (c) an amide solvent or a sulfoxide solvent; (d) a phosphorus-containing compound; (e) an oxycarboxylic acid; and (f) water. The photoresist stripping composition of the present invention can easily remove photoresist film formed on an inorganic substrate, photoresist residues, and dust or similar matter generated during an etching process in the production of liquid crystal display elements or semiconductor elements, and is highly anticorrosive to various materials such as semiconductor layer materials, conductive materials, and insulating materials.

6 Claims, 1 Drawing Sheet

PHOTORESIST STRIPPING COMPOSITION AND PROCESS FOR STRIPPING RESIST

FIELD OF THE INVENTION

The present invention relates to a photoresist stripping composition and to a process for stripping photoresist, and more particularly, to a stripping composition for removing photoresist film in the production of semiconductor elements and liquid crystal display elements, and to a process for stripping photoresist.

BACKGROUND ART

Semiconductor elements have been produced by the steps of applying a photoresist to an inorganic substrate; forming a pattern of the photoresist through exposure to light and subsequent development; etching the region of the inorganic substrate which has not been masked by use of the photoresist pattern as a mask, to thereby form minute circuits; and removing the photoresist film from the inorganic substrate. Alternatively, after forming minute circuits in the same manner, the photoresist pattern is ashed, and then the remaining resist residue is removed from the inorganic substrate.

In recent years, LCDs (liquid crystal displays), inter alia, TFT-LCDs (thin-film transistor liquid crystal displays), are coming to have a larger substrate size, raising problems caused by nonuniformity in film formation of circuit-forming materials, insulating materials, and resist materials as well as uneven exposure, development, and etching, and resulting in increased rate of defective products.

In particular, the nonuniformity in formed film causes generation of dust by exfoliation of the formed film during wet-etching, or generation of dust originating from a resist residue during dry-etching. Such dust cannot be removed during stripping of a resist even by use of a photoresist stripping solution. In some cases, the unremoved dust causes unsatisfactory bonding of thin film formed in the subsequent step. Thus, the nonuniformity in photoresist film finally results in defective products.

In connection with conventional methods for stripping photoresist after dry-etching the above thin films, the Japanese Patent Applications Laid-Open (kokai) Nos. 62-49355, 62-95531, 64-981949, 64-81950, and 5-273768 disclose photoresist stripping solutions containing amino alcohol. However, these photoresist stripping solutions exert no effect of removing dust or similar matter generated during etching.

SUMMARY OF THE INVENTION

Thus, an object of the present invention is to provide a photoresist stripper which is capable of easily removing photoresist film formed on an inorganic substrate, photoresist residues, and dust or similar matter generated during etching process in the production of liquid crystal display elements or semiconductor elements, and which is highly anticorrosive to various materials such as semiconductor layer materials, conductive materials, and insulating materials. Another object of the present invention is to provide a process for stripping photoresist.

The present inventors have carried out extensive studies in order to solve the aforementioned problems involved in conventional techniques, and have found that a photoresist stripping composition comprising (a) an alkanolamine other than those alkanolamines falling under the definition of the below-described component (b); (b) an alkanolamine having in the molecule thereof at least one moiety represented by the following formula (1):

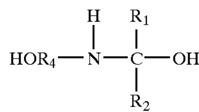

(1)

(wherein each of $R_1$ and $R_2$ represents hydrogen or a methyl group, and $R_4$ represents a C1–C5 alkyl group); (c) an amide solvent or a sulfoxide solvent; (d) a phosphorus-containing compound; (e) an oxycarboxylic acid; and (f) water, can completely remove photoresist thin film, photoresist film, photoresist residues, and dust or similar matter generated during an etching process, at low temperatures and over a short period of time without causing corrosion of the materials. The present invention has been accomplished on the basis of this finding.

PREFERRED EMBODIMENTS OF THE INVENTION

Figure 1:
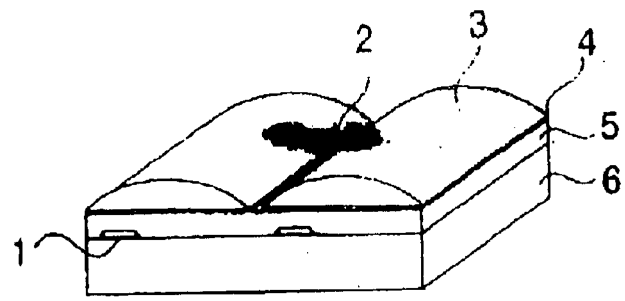
FIG. 1 is a schematic view showing a display element after ITO film has been wet-etched by use of an aqueous ferric chloride/hydrochloric acid solution while resist film is used as a mask.

Examples of alkanolamines falling under the definition of the component (a) employed in the present invention include aliphatic alkanolamines. Specific examples include ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropan-1-ol, N-methyl-2-aminopropan-1-ol, N-ethyl-2-aminopropan-1-ol, 1-aminopropan-3-ol, N-methyl-1-aminopropan-3-ol, N-ethyl-1-aminopropan-3-ol, 1-aminobutan-2-ol, N-methyl-1-aminobutan-2-ol, N-ethyl-1-aminobutan-2-ol, 2-aminobutan-1-ol, N-methyl-2-aminobutan-1-ol, N-ethyl-2-aminobutan-1-ol, 3-aminobutan-1-ol, N-methyl-3-aminobutan-1-ol, N-ethyl-3-aminobutan-1-ol, 1-aminobutan-4-ol, N-methyl-1-aminobutan-4-ol, N-ethyl-1-aminobutan-4-ol, 1-amino-2-methylpropan-2-ol, 2-amino-2-methylpropan-1-ol, 1-aminopentan-4-ol, 2-amino-4-methylpentan-1-ol, 2-aminohexan-1-ol, 3-aminoheptan-4-ol, 1-aminooctan-2-ol, 5-aminooctan-4-ol, 1-aminopropan-2,3-diol, 2-aminopropan-1,3-diol, tris(oxymethyl)aminomethane, 1,2-diaminopropan-3-ol, 1,3-diaminopropan-2-ol, 2-(2-aminoethoxy)ethanol, and 2-(2-aminoethylamino)ethanol.

Of these, compounds represented by the following formula (2):

$$HOR_3\text{—}NH_2 \quad (2)$$

(wherein $R_3$ represents a C1–C5 alkyl group) are particularly preferred.

Examples of alkanolamines falling under the definition of the component (b) employed in the present invention and having, in the molecule thereof, at least one moiety represented by formula (1) include aliphatic alkanolamines. Specific examples include N-hydroxymethylethanolamine (CAS No. 65184-12-5), N-(α-hydroxyethyl)ethanolamine, N,N-(di-α-hydroxymethyl)ethanolamine, N-hydroxyethylethanolamine, N,N-(di-α-hydroxyethyl) ethanolamine, N-hydroxymethyldiethanolamine, N-(α-hydroxyethyl)diethanolamine, N-hydroxymethyl-N-methylethanolamine, N-(α-hydroxyethyl)-N-methylethanolamine, N-hydroxymethyl-N-propylethanolamine, N-(α-hydroxyethyl)-N-propylethanolamine, N-hydroxymethyl-N-butylethanolamine, N-(α-hydroxyethyl)-N-butylethanolamine, N-hydroxymethylisopropanolamine, N-(α-hydroxyethyl)isopropanolamine, N,N-dihydroxymethylisopropanolamine, N,N-(di-α-hydroxyethyl)isopropanolamine, N-hydroxymethyldiisopropanolamine, N-(α-hydroxyethyl) diisopropanolamine, N-hydroxymethyl-N-methylisopropanolamine, N-(α-hydroxyethyl)-N-methylisopropanolamine, N-hydroxymethyl-N-ethylisopropanolamine, N-(α-hydroxyethyl)-N-ethylisopropanolamine, N-hydroxymethyl-N-propylisopropanolamine, N-(α-hydroxyethyl)-N-propylisopropanolamine, N-hydroxymethyl-N-butylisopropanolamine, N-(α-hydroxyethyl)-N-butylisopropanolamine, N-hydroxymethylaminoethoxyethanol, N-(α-hydroxyethyl) aminoethoxyethanol, N,N-dihydroxymethylaminoethoxyethanol, N,N-(di-α-hydroxyethyl)aminoethoxyethanol, N-hydroxymethylamino-2-methylpropanol, N-(α-hydroxyethyl)amino-2-methylpropanol, N,N-dihydroxymethylamino-2-methylpropanol, and N,N-(di-α-hydroxyethyl)amino-2-methylpropanol.

Of these, compounds represented by the following formula (3):

$$HOR_4\text{—}NH\text{—}CH_2OH \quad (3)$$

(wherein $R_4$ represents a C1–C5 alkyl group) are particularly preferred.

The composition of the present invention contains the aforementioned component (a) in an amount of 10 to 90 wt. %, preferably 20 to 80 wt. %, based on the total amount of the composition, and contains the aforementioned component (b) in an amount of 0.01 to 30 wt. %, preferably 1 to 20 wt. %, based on the total amount of the composition.

Examples of amide solvents serving as the component (c) of the present invention include dimethylformamide, diethylformamide, dimethylacetamide, diethylacetamide, and N-methylpyrrolidone. Examples of sulfoxide solvents falling under the definition of the component (c) include dimethyl sulfoxide and diethyl sulfoxide. The component (c) content in the composition is 10 to 90 wt. % based on the total amount of the composition.

Examples of phosphorus-containing compounds serving as the component (d) of the present invention include phosphoric acids, phosphate ester surfactants, and phosphonic acid chelating agents. Specific examples of the phosphoric acids include phosphoric acids such as orthophosphoric acid, hypophosphoric acid, phosphorous acid, and hypophosphorous acid; pyrophosphoric acid, trimetaphosphoric acid, tetrametaphosphoric acid, orthophosphorous acid, and polymetaphosphorous acid. In addition, salts such as ammonium salts, amine salts, and quaternary ammonium salts of these phosphoric acids may also be used.

Examples of the phosphate ester surfactants include compounds represented by the following formula (4):

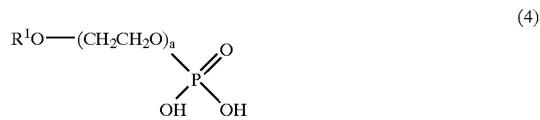

(wherein $R^1$ represents a C1–C30 alkyl group or a C7–C30 alkylaryl group; and a is an integer of 1 to 200), and compounds represented by the following formula (5):

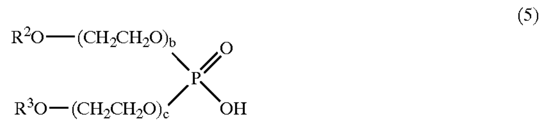

(wherein each of $R^2$ and $R^3$, which may be identical to or different from each other, represents a C1–C30 alkyl group or a C7–C30 alkylaryl group; b is an integer of 1 to 200, and c is an integer of 1 to 200).

In the compounds falling under the definition of the above formula (4) or (5), the C1–C30 alkyl group is preferably a C2–C12 alkyl group, and the C7–C30 alkylaryl group is preferably a C14–C18 alkylaryl group. Commercial products of the phosphate ester surfactants are preferably used. Examples include Adekacol (product of Asahi Denka Kogyo K.K.), Plysurf (product of Dai-Ichi Kogyo Seiyaku Co., Ltd.), Phosphanol (product of Toho Chemical Industry Co., Ltd.), and Newcol and Antox (products of Nippon Nyukazai Co., Ltd.).

The phosphonic acid chelating agents may be chelating agents having at least one phosphonic acid group or its salt form in the molecule thereof. Examples include phosphonic acids such as methyldiphosphonic acid, hydroxyethanediphosphonic acid, aminotrismethylenephosphonic acid, ethylidenediphosphonic acid, 1-hydroxyethyliden-1,1-diphosphonic acid, 1-hydroxypropylidene-1,1-diphosphonic acid, ethylaminobismethylenephosphonic acid, dodecylaminobismethylenephosphonic acid, nitorilotrismethylenesphonic acid, ethylenediaminebismethylenephosphonic acid, ethylenediaminetetrakismethylenephosphonic acid, hexenediaminetetrakismethylenephosphonic acid, diethylenetriaminepentamethylenephosphonic acid, and 1,2-propanediaminetetramethylenephosphonic acid; ammonium salts thereof; alkali metal salts thereof; and organic amine salts thereof. The phosphorus-containing compounds may be oxidized forms of the phosphonic acid chelating agents such as N-oxides formed through oxidation of a nitrogen atom contained in the phosphonic acid chelating agents.

In the composition of the present invention, these phosphorus-containing compounds may be used singly or in combination of two or more species.

The amounts of these phosphorus-containing compounds which are incorporated into the composition of the present invention are appropriately determined with reference to various conditions. The amounts are preferably 0.01 to 10 wt. %, more preferably 0.1 to 5 wt. %, based on the total amount of the composition. When the amounts of the phosphorus-containing compounds fall within the above ranges, resist residues can be removed sufficiently, and photoresist removability can be enhanced.

Examples of the oxycarboxylic acid serving as component (e) of the present invention include glycolic acid, lactic acid, α-oxybutyric acid, glyceric acid, tartronic acid, malic acid, tartaric acid, and citric acid. The composition contains component (e) in an amount of 0.01 to 5 wt. % based on the total amount of the composition.

The composition of the present invention is an aqueous composition containing the aforementioned components (a) to (e), the balance being water (f). Typically, the composition is an aqueous solution.

The process for stripping photoresist according to the present invention is directed to removal of a photoresist by use of the aforementioned stripping composition, particularly to removal of photoresist film formed on an inorganic substrate in the production of semiconductor integrated circuits or liquid crystal displays. The inorganic substrate may be formed of a variety of materials. Examples include semiconductor materials and wiring materials such as silicon, amorphous silicon, polysilicon, silicon oxide film, silicon nitride film, aluminum, aluminum alloys, titanium, titanium-tungsten, titanium nitride, tungsten, tantalum, tantalum nitride, tantalum alloys, chromium, chromium oxides, chromium alloys, molybdenum, and ITO (indium-tin-oxide); compound semiconductors such as gallium arsenide, gallium phosphide, and indium phosphide; and glass substrates for LCD.

The photoresist stripper of the present invention is employed for removing photoresist film coated on an inorganic substrate, patterned photoresist film remaining on an inorganic substrate after an etching process, or photoresist residues remaining after ashing of patterned photoresist film subsequent to the etching process. When stripping is performed, heating, ultrasonication, or the like may be appropriately employed in accordance with needs.

The stripping composition of the present invention is generally utilized in immersion treatment. Other methods such as spraying may be employed. When immersion treatment is performed, the following conditions are usually preferred: room temperature to 100° C. for 0.5 to 20 minutes.

After completion of the treatment with the stripping composition, the treated substrate may be rinsed by use of water or an organic solvent such as alcohol.

By use of the photoresist stripping composition according to the present invention, photoresist film coated on an inorganic substrate, patterned photoresist film remaining on an inorganic substrate after an etching process, photoresist residues remaining after ashing of patterned photoresist film subsequent to the etching process, and dust generated during the etching process are easily removed at low temperatures and over a short period of time. During the stripping treatment, the circuit-forming materials do not undergo corrosion and can be minutely processed, enabling production of high-precision and high-quality circuits.

The present invention will next be described in more detail by way of examples, which should not be construed as limiting the invention thereto.

EXAMPLE 1

FIG. 1 is a schematic view showing a display element after wet-etching ITO film by use of an aqueous ferric chloride/hydrochloric acid solution while a resist film is used as a mask.

On a glass substrate 6, a TFT 1 is formed. Passivation film 5 is formed on the TFT 1. On the passivation film 5, transparent electrodes (ITO) 4 serving as pixel electrodes are formed. Resist 3 still remains over the transparent electrodes.

Dust 2, which is conceived to comprise a mixture of the ITO 4 and resist 5 generated during wet-etching, also remains over the ITO electrodes 4 and the resist 3.

The substrate shown in FIG. 1 was immersed at 50° C. for 3 minutes in a stripping composition comprising isopropanolamine (70 wt. %), N-hydroxymethylisopropanolamine (5 wt. %), dimethylsulfoxide (19.4 wt. %), citric acid (0.1 wt. %), and a phosphate surfactant (Antox EHD400, product of Nippon Nyukazai Co., Ltd.) (0.5 wt. %), and water (balance). After immersion, the substrate was rinsed with ultrapure water, and then dried.

Figure 2:
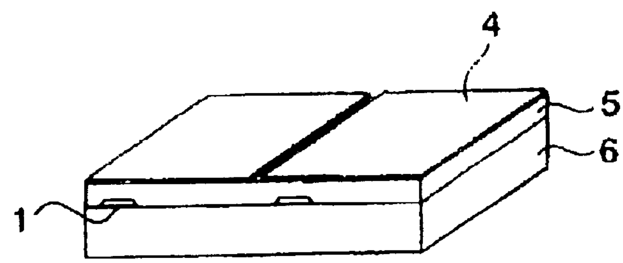
FIG. 2 is a schematic view showing the display element of FIG. 1 after resist film and dust have been removed by use of a stripping composition of Examples of the present invention.

Thereafter, the surface of the thus-treated substrate was observed under a scanning electron microscope (SEM). As shown in FIG. 2, the resist 3 and the dust 2 were completely removed.

EXAMPLES 2 TO 9

A liquid crystal panel shown in FIG. 1 was immersed in each of stripping compositions having compositional proportions shown in Table 1 under the conditions shown in Table 1. After completion of immersion, the panel was rinsed with ultrapure water, and then dried. Subsequently, the panel was observed under an SEM so as to evaluate removability of resist and dust. The results are shown in Table 1.

The results of evaluation through SEM observation are expressed by the following ratings.

(Degree of Removal)

AA: Completely removed

BB: Almost completely removed

CC: Partially remained

DD: Mostly remained

Comparative Examples 1 to 7

Figure 3:
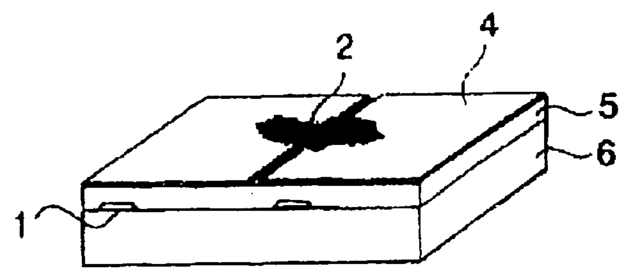
FIG. 3 is a schematic view showing the display element of FIG. 1 after resist film and dust have been removed by use of a stripping composition of Comparative Example 2.

Liquid crystal panels identical with those employed in the Examples were immersed in each of stripping compositions having compositional proportions shown in Table 2 under the conditions shown in Table 2. After completion of immersion, each panel was rinsed with ultrapure water, and then dried. SEM observation was carried out in a manner similar to that employed in the Examples so as to evaluate removability of resist and dust on the basis of the above ratings. The results are shown in Table 2. FIG. 3 is a schematic view showing a liquid crystal panel after stripping treatment in which the resist 3 was removed but the dust 2 still remained (corresponding to Comparative Example 4).

TABLE 1

| | Stripping compositions: Alkanolamine [A] Species, Content (wt. %) | Alkanolamine [B] Species, Content (wt. %) | Solvent Species, Content (wt. %) | Hydroxy-carboxylic acid Species, Content (wt. %) | Phosphorous-containing compound Species, Content (wt. %) | Water Content (wt. %) | Stripping conditions Temp. (° C.) | Stripping conditions Time (min) | Resist 3 remov-ability | Dust 2 remov-ability |
|---|---|---|---|---|---|---|---|---|---|---|
| Ex. 2 | A1 60 | B1 5 | Dimethyl sulfoxide 24.4 | Citric acid 0.1 | Antox EHD 400*[1] 0.5 | 10 | 45 | 5 | AA | AA |
| 3 | A2 70 | B2 5 | Dimethyl sulfoxide 19.4 | Malic acid 0.1 | Antox EHD 400*[1] 0.5 | 5 | 50 | 3 | AA | AA |
| 5 | A2 70 | B2 5 | Dimethyl sulfoxide 19.3 | Tartaric acid 0.2 | Antox EHD 400*[1] 0.5 | 5 | 50 | 3 | AA | AA |
| 6 | A2 70 | B2 5 | Dimethyl sulfoxide 19.4 | Citric acid 0.1 | Antox EHD 400*[1] 0.5 | 5 | 50 | 3 | AA | AA |
| 7 | A2 60 | B2 10 | Dimethyl sulfoxide 24.4 | Citric acid 0.1 | Antox EHD 400*[1] 0.5 | 5 | 50 | 5 | AA | AA |
| 8 | A2 70 | B2 5 | Dimethyl sulfoxide 19.4 | Citric acid 0.1 | Antox EHD 400*[1] 0.5 | 5 | 60 | 1 | AA | AA |
| 9 | A2 70 | B2 5 | Dimethyl sulfoxide 194 | Citric acid 0.1 | Antox EHD 400*[1] 0.5 | 5 | 40 | 10 | AA | AA |

*[1]Product of Nippon Nyukazai Co., Ltd.
A1: Monoethanolamine
A2: Isopropanolamine
B1: N-hydroxymethylethanolamine
B2: N-hydroxymethylisopropanolamine

TABLE 2

| | Stripping compositions: Alkanolamine [A] Species, Content (wt. %) | Alkanolamine [B] Species, Content (wt. %) | Solvent Species, Content (wt. %) | Hydroxy-carboxylic acid Species, Content (wt. %) | Phosphorous-containing compound Species, Content (wt. %) | Water Content (wt. %) | Stripping conditions Temp. (° C.) | Stripping conditions Time (min) | Resist 3 remov-ability | Dust 2 remov-ability |
|---|---|---|---|---|---|---|---|---|---|---|
| Comp. Ex. 1 | A3 70 | — | Dimethyl sulfoxide 30 | — | — | — | 50 | 10 | DD | DD |
| 2 | A2 70 | — | Dimethyl sulfoxide 30 | — | — | — | 50 | 10 | DD | DD |
| 3 | A2 70 | B2 5 | Dimethyl sulfoxide 25 | — | — | — | 50 | 10 | CC | DD |
| 4 | A2 70 | B2 5 | Dimethyl sulfoxide 20 | — | — | 5 | 50 | 10 | AA | DD |
| 5 | A2 70 | B2 5 | Dimethyl sulfoxide 19.9 | Citric acid 0.1 | — | 5 | 50 | 10 | AA | CC |
| 6 | A2 70 | B2 5 | Dimethyl sulfoxide 19.5 | — | Antox EHD 400*[1] 0.5 | 5 | 50 | 10 | AA | CC |
| 7 | A2 70 | B2 5 | Dimethyl sulfoxide 19.5 | Citric acid 0.1 | — | 5 | 50 | 20 | AA | CC |

*[1]Product of Nippon Nyukazai Co., Ltd.
A2: Isopropanolamine
A3: Ethanolamine
B2: N-hydroxymethylisopropanolamine

What is claimed is:

1. A photoresist stripping composition comprising, each based on the total weight of the composition, (a) 20–80 wt. % of an alkanolamine represented by the following formula (2):

$$HOR_3—NH_2 \quad (2)$$

(wherein $R_3$ represents a C1–C5 alkyl group); (b) 1–20 wt. % of an alkanolamine represented by the following formula (3):

$$HOR_4—NH—CH_2OH \quad (3)$$

(wherein $R_4$ represents a C1–C5 alkyl group); (c) 10–90 wt. % of a sulfoxide solvent; (d) 0.1–5 wt. % of a phosphorus-containing compound; (e) 0.01–5 wt. % of an oxycarboxylic acid; and (f) water; wherein the oxycarboxylic acid (e) is selected from the group consisting of malic acid and citric acid.

2. A process for stripping a photoresist comprising stripping a photoresist by use of a photoresist stripping composition as recited in claim 1.

3. A process for stripping photoresist comprising forming a mask on an inorganic substrate by use of photoresist film; etching a portion of the inorganic substrate which has not been masked; and subsequently stripping the photoresist film forming the mask by use of a photoresist stripping composition as recited in claim 1.

4. A process for stripping photoresist comprising forming a mask on an inorganic substrate by use of photoresist film; etching a portion of the inorganic substrate which has not been masked; ashing the photoresist film forming the mask; and subsequently stripping a remaining photoresist residue by use of a photoresist stripping composition as recited in claim 1.

5. A process for stripping photoresist as recited in claim 4, wherein after said ashing, dust remains, and in said stripping the dust is also stripped by use of said photoresist stripping composition.

6. A process for stripping photoresist as recited in claim 4, wherein after said etching, dust remains, and in said stripping the dust is also stripped by use of said photoresist stripping composition.

* * * * *